United States Patent
Moreau et al.

(10) Patent No.: US 7,960,095 B2
(45) Date of Patent: Jun. 14, 2011

(54) USE OF MIXED BASES TO ENHANCE PATTERNED RESIST PROFILES ON CHROME OR SENSITIVE SUBSTRATES

(75) Inventors: Wayne M. Moreau, Wappingers Falls, NY (US); Marie Angelopoulos, Cortlandt Manor, NY (US); Wu-Song Huang, Poughkeepsie, NY (US); David R. Medeiros, Ossining, NY (US); Karen E. Petrillo, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 10/597,904

(22) PCT Filed: Feb. 11, 2004

(86) PCT No.: PCT/US2004/004144
§ 371 (c)(1),
(2), (4) Date: Aug. 11, 2006

(87) PCT Pub. No.: WO2005/088393
PCT Pub. Date: Sep. 22, 2005

(65) Prior Publication Data
US 2008/0227030 A1    Sep. 18, 2008

(51) Int. Cl.
G03F 7/20    (2006.01)
G03F 7/30    (2006.01)
G03F 7/36    (2006.01)
G03F 7/38    (2006.01)
G03F 7/039   (2006.01)

(52) U.S. Cl. ............ 430/313; 430/270.1; 430/311; 430/317; 430/318; 430/326; 430/330; 430/942

(58) Field of Classification Search .......... None
See application file for complete search history.

(56) References Cited

U.S. PATENT DOCUMENTS

| 4,814,244 A * | 3/1989 | Koguchi et al. ......... 430/30 |
| 4,855,017 A | 8/1989 | Douglas |
| 4,954,218 A * | 9/1990 | Okumura et al. ........ 438/439 |
| 5,362,663 A | 11/1994 | Bronner et al. |
| 5,429,710 A | 7/1995 | Akiba et al. |
| 5,562,801 A | 10/1996 | Nulty |
| 5,618,751 A | 4/1997 | Golden et al. |
| 5,712,078 A | 1/1998 | Huang et al. |
| 5,731,131 A * | 3/1998 | Momma et al. .......... 430/311 |
| 5,744,376 A | 4/1998 | Chan et al. |
| 5,801,094 A | 9/1998 | Yew et al. |
| 5,821,469 A | 10/1998 | Shanmugham |
| 5,876,900 A | 3/1999 | Watanabe et al. |
| 5,919,597 A | 7/1999 | Sinta et al. |
| 5,948,570 A | 9/1999 | Kornblit et al. |
| 5,985,512 A | 11/1999 | Hatakeyama et al. |
| 6,037,097 A | 3/2000 | Bucchignano et al. |
| 6,043,003 A | 3/2000 | Bucchignano et al. |
| 2002/0090569 A1* | 7/2002 | Suzuki et al. ........... 430/270.1 |
| 2003/0186161 A1* | 10/2003 | Fujimori ................. 430/270.1 |
| 2003/0194640 A1 | 10/2003 | Sato |
| 2003/0194650 A1 | 10/2003 | Kanna et al. |
| 2004/0259028 A1 | 12/2004 | Sato |
| 2005/0053861 A1* | 3/2005 | Yoneda et al. .......... 430/270.1 |
| 2005/0164123 A1 | 7/2005 | Mizutani |

FOREIGN PATENT DOCUMENTS

| CN | 1254944 A | 5/2000 |
| EP | 0628876 A1 | 12/1994 |
| EP | 1319981 A | 6/2003 |
| EP | 1338922 A | 8/2003 |
| EP | 1489459 A | 12/2004 |
| EP | 1557720 A | 7/2005 |
| JP | H09325496 | 12/1997 |
| JP | H11-282166 | 10/1999 |
| JP | 2001125272 | 5/2001 |
| JP | 2002511505 | 4/2002 |
| JP | 200343679 | 2/2003 |
| JP | 200355341 | 2/2003 |

OTHER PUBLICATIONS

Dean, et al.—Investigation of Deep Ultraviolet Photoresists on TiN Substrates—514/SPIE Proceed, vol. 2438 (1995).
International Search Report dated Nov. 5, 2004.

* cited by examiner

Primary Examiner — Sin J. Lee
(74) Attorney, Agent, or Firm — Steven Capella; Katherine S. Brown

(57) ABSTRACT

Resist compositions having good footing properties even on difficult substrates are obtained by using a combination of base additives including a room temperature solid base, and a liquid low vapor pressure base. The compositions are especially useful on metal substrates such as chromium-containing layers commonly used in mask-making.

5 Claims, No Drawings

USE OF MIXED BASES TO ENHANCE PATTERNED RESIST PROFILES ON CHROME OR SENSITIVE SUBSTRATES

BACKGROUND OF THE INVENTION

In the microelectronics industry as well as in other industries involving construction of microscopic structures (e.g. micromachines, magnetoresistive heads, etc.), lithography is used to obtain patterned structures of various materials such as insulators, semiconductors and/or metals in a sequence leading to the achievement of the desired structure.

Most lithographic processes (excluding so-called direct-write techniques) typically employ some type of patterned mask through which the imaging radiation is projected onto a resist material (to be patterned) on the substrate of interest. The interface between the resist layer and the substrate often presents problems in terms of interactions (chemical and/or optical) that prevent or compromise lithographic performance. For example, in the context of mask-making, if the resist layer is applied directly over chromium-containing film which comprises chromium oxynitride and/or chromium oxide over chromium on the substrate (e.g., a glass plate), footing may occur during the lithographic process which leads to a loss of pattern accuracy.

The formation of distorted profiles of chemically amplified (a.k.a., acid-catalyzed) resist on certain substrates has been attributed to poisoning by basic surface groups or surface energetics which intercept photo or generated acid near the interface and cause "footing" with positive resist or "coving" with negative resist. See K. Dean et al., SPIE Proceed., 2438, 514 (1995).

Attempts have been made to address the footing problem by treatment or alteration of the substrate (e.g., treatment with acids or oxidation of chromium), however such methods may not be compatible with device or mask production. Such treatments also add cost to the manufacturing process. Thus, there is a need for improved resist formulations which avoid these types of adverse interaction with underlying substrates, especially in the context of patterning chromium-containing materials commonly used in mask making.

SUMMARY OF THE INVENTION

The invention provides improved resist compositions and methods using those compositions to form patterned material structures. The compositions and methods of the invention are characterized by the presence of a combination of base additives including a room temperature (20-25° C.) solid base, and a room temperature liquid low vapor pressure base. The invention advantageously addresses the footing problem without the need for substrate treatments or special processing steps.

In one aspect, the invention encompasses a chemically amplified resist composition, the composition comprising:
 an imaging polymer,
 b) acid-labile moieties,
 c) a radiation-sensitive acid generator, and
 d) a base additive component, wherein the base additive component
 comprises:
 a room temperature solid base, and
 a room temperature liquid low vapor pressure base.

The low vapor pressure base preferably has a vapor pressure of about 2 mm or less at room temperature, more preferably about 1 mm or less. The imaging polymer preferably comprises low activation energy acid-sensitive moieties.

In another aspect, the invention encompasses a method of forming a patterned material structure on a substrate, the method comprising:
 providing a substrate with a layer of the material,
 applying a resist composition of the invention to the substrate to form a resist layer on the substrate,
 patternwise exposing the substrate to radiation whereby acid is generated by radiation-sensitive acid generator of the resist in exposed regions of the resist layer,
 developing a patterned resist structure in the resist layer by removing radiation exposed portions of the resist, and
 transferring resist structure pattern to the material layer by removing portions of the material layer through spaces in the resist structure pattern.

The material layer is preferably selected from the group consisting of organic dielectrics, metals, ceramics, and semiconductors, more preferably chromium-containing compositions, SiON or TiN, most preferably chromium-containing compositions. The transfer preferably comprises reactive ion etching or wet etching. The radiation used in step (C) is preferably electron beam, ion beam or laser radiation.

The invention also encompasses a method of forming a material structure on or in a substrate, the method comprising:
 providing a substrate,
 applying a resist composition of the invention to the substrate to form a resist layer on the substrate,
 patternwise exposing the substrate to radiation whereby acid is generated by radiation-sensitive acid generator of the resist in exposed regions of the resist layer,
 developing a patterned resist structure in the resist layer by removing radiation exposed portions of the resist, and
 transferring resist structure pattern to a material by depositing the material onto the substrate at spaces in the resist structure pattern or implanting material into the substrate at spaces in the resist structure pattern.

These and other aspects of the invention are described in further detail below.

DETAILED DESCRIPTION OF THE INVENTION

The resist compositions of the invention are characterized by the presence of a combination of base additives including a room temperature (20-25° C.) solid base, and a room temperature liquid low vapor pressure base.

The resist of the invention composition preferably comprises:
 an imaging polymer,
 acid-labile moieties,
 a radiation-sensitive acid generator, and
 a base additive component, wherein the base additive component
 comprises:
 a room temperature solid base, and
 a room temperature liquid low vapor pressure base.

The imaging polymer may be a homopolymer, copolymer, terpolymer or a polymer consisting of four or more differing monomeric repeat units. The polymers comprising more than one type of monomer (copolymer, terpolymer, etc. . . . ) shall hereto be referred to simply as copolymer for simplicity but with the understanding that more than two monomer types may comprise the polymeric entity. The polymers will preferably have a molecular weight of about 1000 to 50,000 Daltons (more preferably about 2000 to 10000) and will preferably have a polydispersity between 1 and 5. Examples of suitable polymers include poly(hydroxystyrene), poly(vinylbenzoic acid), poly(acrylic acid), poly(methacrylic acid), poly(norbornene carboxylic acid), poly(5-(1,1,1,3,3,3- hexafluoromethyl-2-hydroxy propyl)norbornene), poly(hydroxy perfluorostyrene), and derivatives and copolymers thereof. The most preferred polymers are copolymers of poly (4-hydroxystyrene).

Acid-labile moieties are preferably pendant from the polymer and/or are provided in the polymer matrix as separate dissolution inhibitor molecules containing acid labile moieties. If used, the dissolution inhibitor preferably does not act as crosslinker when its acid labile moiety or moieties are cleaved. The acid labile moieties are preferably cleavable in the presence of acid at room temperature. Preferred acid labile moieties are those classified as low activation energy protecting groups (e.g., Ea <20 kcal/mol.). The acid labile moieties are preferably selected from the group consisting of acetals, ketals, and orthoesters, more preferably, the acid labile moieties are ketal moieties such as those described in U.S. Pat. No. 5,712,078 and EP Published Application EP0628876A1, the disclosures of which is incorporated herein by reference. Examples of preferred ketal protecting groups include, but are not limited to, methoxy propyl, methoxy cyclohexyl and benzyloxy propyl and derivatives and analogs thereof. Where the acid labile groups are pendant from the imaging polymer, the imaging polymer preferably contains about 5 and 95 mole % of the acid labile protecting groups (based on the total functional groups on the imaging polymer), more preferably about 10 to 40 mole %, most preferably about 20 to 30 mole %. Preparation of such polymers is taught in U.S. Pat. Nos. 5,919,597 and 6,037,097 and 6,043,003, the disclosures of which are incorporated herein by reference. Methoxy cyclohexyl ketal is a most preferred protecting group.

A variety of radiation-sensitive acid generators (a.k.a., photoacid generator or PAG) can be used in the resist formulation of the invention. Suitable PAGs include, but are not limited to, sulfonium and iodonium sulfonates, the anions of which may be totally or partially substituted with fluorine. Preferred examples include triaryl sulfonium perfluoroalkylsulfonates such as triphenylsulfonium triflate, triphenylsulfonium nonaflate, tris(t-butylphenyl)sulfonium triflate, t-butylphenyl diphenylsulfonium triflate, t-butylphenyl diphenylsulfonium nonaflate, t-butylphenyl diphenylsulfonium perfluorooctanesulfonate and similar derivatives and analogs. Other preferred PAGs are diaryl iodonium perfluoroalkane sulfonates (e.g., diphenyliodonium nonaflate and bis(t-butylphenyl)iodonium triflate), diaryl-alkyl sulfonium salts, dialkyl-arylsulfonium salts and derivatives thereof, triarylsulfonium bis(perfluoroalkyl)amides and tris(perfluoroalkyl)methides and the corresponding diaryliodonium analogs. Preferably, the resist formulation contains about 0.1 to 20 wt. % of the acid generator based on the weight of the imaging polymer, more preferably about 0.5-15 wt. %.

The base additive component of the resist comprises:
a room temperature solid base, and
a room temperature liquid low vapor pressure base.

The solid base is preferably selected from the group consisting of aromatic amines and imidazoles. Preferred solid bases are N,N-dimethylaminopyridine (DMAP) and triphenylimidazole. The low vapor pressure base preferably has a vapor pressure of about 2 mm or less at room temperature, more preferably about 1 mm or less. The low vapor pressure base is preferably selected from the group consisting of triethanolamine, 1-naphthylamine, 2-naphthylamine, diphenylamine, acetanilide, 3,6,9-triazaundecamethylenediamine, 4,4'-propane-1,3-diylbismorpholine, and 1,8-azabicycloundecene. Triethanolamine is a preferred low vapor pressure base. The composition preferably contains about 2 wt. % or less of base component (based on the total weight of imaging polymer), more preferably about 0.0025 to 1 wt. %. The mole ratio of low vapor pressure base to that of the solid base is preferably about 0.05 to 20, more preferably about 0.1 to 5 and most preferably 0.15 to 0.5.

The resist may contain other known additives such as sensitizers, dyes, surfactants, etc.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The resist compositions of the invention can be prepared by combining the polymer, dissolution inhibitor (if used), acid generator, base component, and any other desired ingredients using conventional methods. The resist composition to be used in lithographic processes will generally have a significant amount of solvent.

The resist compositions of the invention are especially useful for lithographic processes used in the manufacture of masks or the manufacture of integrated circuits on semiconductor substrates. For mask-making, electron beam radiation is typically used. Where use of other radiation (e.g. mid-UV, 248 nm deep UV, 193 nm UV, or x-ray) is desired, the compositions of the invention can be adjusted (if necessary) by the addition of an appropriate dye or sensitizer to the composition.

The invention encompasses a method of forming a patterned material structure on a substrate, the method comprising:
  providing a substrate with a layer of the material,
  applying a resist composition of the invention to the substrate to form a resist layer on the substrate,
  patternwise exposing the substrate to radiation whereby acid is generated by radiation-sensitive acid generator of the resist in exposed regions of the resist layer,
  developing a patterned resist structure in the resist layer by removing radiation exposed portions of the resist, and
  transferring resist structure pattern to the material layer by removing portions of the material layer through spaces in the resist structure pattern.

The material layer is preferably selected from the group consisting of organic dielectrics, metals, ceramics, and semiconductors. The invention is most useful in the context where the material layer to be patterned is a chromium-containing composition, SiON or TiN, most preferably a chromium-containing composition. The material to be patterned may be applied using any suitable technique. The substrate is preferably a semiconductor wafer or a glass (e.g., fused quartz) plate.

If desired, an antireflective coating (ARC) may be applied over the material layer before application of the resist layer. The ARC layer may be any conventional ARC which is compatible with acid catalyzed resists, the underlying material layer, subsequent processing.

Typically, the solvent-containing resist composition may then be applied to the desired substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., electron beam or deep UV radiation). Where scanning particle beams (such as scanning electron beam) are used, patternwise exposure may be achieved by scanning the beam across the substrate to selectively apply the beam energy in the desired pattern. Where wavelike radiation forms such as 248 nm ultraviolet radiation, the patternwise exposure is typically conducted through a mask which is placed over the resist layer. For 248 nm UV radiation, the total exposure energy is preferably about 100 millijoules/cm$^2$ or less, more preferably about 50 millijoules/cm$^2$ or less (e.g. 15-30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60-175° C., more preferably about 90°-160° C. The post-exposure bake is preferably conducted for about 30 seconds to 5 minutes. For low activation energy resists, the post-exposure bake may be optionally omitted or performed under milder conditions.

After post-exposure bake (if used), the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21 N or other aqueous alkaline solutions. The resulting resist structure on the substrate is then typically dried to remove any remaining developer solvent.

The pattern from the resist structure may then be transferred to the material (e.g., organic dielectric, ceramic, metal or semiconductor) of the underlying substrate. Typically, the transfer is achieved by reactive ion etching, wet etching or some other etching technique. The most preferred application for the resist materials of the invention is in the patterning of metal layers, especially chromium-containing metal compositions as are commonly used for mask-making. In such applications, a halogen compound-containing pattern transfer etchant where the halogen is Cl, Br or I is typically used (e.g., $Cl_2$, $Br_2$, $I_2$, and $BCl_3$). The halogen compound-containing etchant may contain a combination of halogen compounds and/or may contain additional compounds such as a strong oxidant (e.g., $O_2$). A combination of $Cl_2$ and $O_2$ is a generally preferred etchant. The etching process described in U.S. Pat. No. 5,948,570 except that no post-development oxidation step is required using the resist of the present invention. The disclosure of U.S. Pat. No. 5,948,570 is incorporated herein by reference. Other suitable etching techniques also may be used.

The compositions of the invention and resulting resist structures can be used to create other patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; 5,821,469, and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The invention also encompasses a method of forming a material structure on or in a substrate, the method comprising:

providing a substrate, applying a resist composition of the invention to the substrate to form a resist layer on the substrate, patternwise exposing the substrate to radiation whereby acid is generated by radiation-sensitive acid generator of the resist in exposed regions of the resist layer, developing a patterned resist structure in the resist layer by removing radiation exposed portions of the resist, and transferring resist structure pattern to a material by depositing the material onto the substrate at spaces in the resist structure pattern or implanting material into the substrate at spaces in the resist structure pattern.

The deposition of step (E) is preferably done by electroplating, chemical vapor deposition or physical vapor deposition. The material to be deposited in step (E) is preferably selected from the group consisting of organic dielectrics, metals, ceramics, and semiconductors. The method may include additional steps such as lift-off or stripping of the resist layer as may be known in the art.

The examples presented below are for illustrative purposes only, and are not intended as a restriction on the scope of the invention.

Example 1

Comparison

Resist with Single Base (TBAH)

Resist formulations were obtained by using a partially protected polymer, preparation of such polymers was taught in U.S. Pat. Nos. 5,919,597 and 6,037,097 and 6,043,003. The protection level was about 25%. The polymer in propylene glycol methyl ether acetate (PGMEA) solvent was mixed with 0.14 wt. % (relative to the polymer) tetrabutyl ammonium hydroxide (TBAH), and 0.7 wt. % triphenylsulfonium triflate (TPS-Tf). The total solid weight content in the solution was about 12%. Chrome on quartz wafers were used as the substrate. These wafers, purchased from Hoya Corporation, have an antireflective chrome film (AR3) deposited on the substrate that is identical in chemical composition to the chromium containing layer commonly used in mask blanks. The wafers were cleaned in a solution of sulfuric acid and hydrogen peroxide, and followed by a dehydration bake for 5 minutes at 115° C. The resist was spin-coated onto the AR3 chrome on quartz wafer, followed by a hot plate bake step at 110° C. for 1 minute. The resist was then exposed on an IBM-built high throughput e-beam projection system at 75 kV. After exposure, the resist was allowed to stand at room temperature for 30 minutes before being developed with 0.263 N TMAH for 60 seconds. The resulting resist profile had a significant amount of residue between the features, and the profile had a large amount of footing.

Example 2

Comparison

Resist with Room Temperature Solid Single Base (DMAP)

Resist formulations were obtained by mixing a partially protected polymer, as described above, with 0.07 wt. % (relative to the polymer) N,N-dimethylaminopyridine (DMAP), and 0.7 wt. % TPS-Tf. The total solid weight content in the solution was about 12%. As in example 1, chrome on quartz wafers were cleaned in a solution of sulfuric acid and hydrogen peroxide and dehydration baked for 5 minutes at 115° C. The resist was spin-coated onto the chrome on quartz wafer, followed by a hot plate bake step at 110° C. for 1 minute. The resist was then exposed on an IBM-built high throughput e-beam projection system at 75 kV. After exposure, the resist was allowed to stand at room temperature for 30 minutes before being developed with 0.263 N TMAH for 60 seconds. The resulting resist profile had significantly less residue compared to the formulation with the TBAH base, but there was some footing, and the profile was slightly bowed.

Example 3

Comparison

Resist with Liquid Low Vapor Pressure Single Base (TEA)

Resist formulations were obtained by mixing a partially protected polymer, as described above, with 0.08 wt. % (relative to the polymer) triethanol amine (TEA), and 0.7 wt. % TPS-Tf. The total solid weight content in the solution was about 12%. As in example 1, chrome on quartz wafers were cleaned in a solution of sulfuric acid and hydrogen peroxide and dehydration baked for 5 minutes at 115° C. The resist was spin-coated onto the chrome on quartz wafer, followed by a hot plate bake step at 110° C. for 1 minute. The resist was then exposed on an IBM-built high throughput e-beam projection system at 75 kV. After exposure, the resist was allowed to stand at room temperature for 30 minutes before being developed with 0.263 N TMAH for 60 seconds. The resulting resist profile had significantly less residue compared to the formulation with the TBAH base and slightly less residue compared to the DMAP base, but there was some footing, and the profile was slightly undercut.

Example 4

Comparison

Resist with a Equimolar Mixture of Room Temperature Solid Base and Liquid Low Vapor Pressure Base (DMAP & TEA)

Resist formulations were obtained by mixing a partially protected polymer, as described above, with 0.04 wt. % (relative to the polymer) TEA which is equal to 6.31 E-3 mol %, 0.03 wt % (relative to the polymer) DMAP which is equal to 6.31 E-3 mol %, and 0.7 wt. % TPS-Tf. The total solid weight content in the solution was about 12%. As in example 1, chrome on quartz wafers were cleaned in a solution of sulfuric acid and hydrogen peroxide and dehydration baked for 5 minutes at 115° C. The resist was spin-coated onto the chrome on quartz wafer, followed by a hot plate bake step at 110° C. for 1 minute. The resist was then exposed on an IBM-built high throughput e-beam projection system at 75 kV. After exposure, the resist was allowed to stand at room temperature for 30 minutes before being developed with 0.263 N TMAH for 60 seconds. The resulting resist profile had significantly less residue compared to the formulation with the TBAH base similar to the TEA base formulation. There was less footing compared to the DMAP formulation. The profile exhibited a similar amount of bowing as the TEA containing formulation.

Example 5

Resist with Mixtures of Room Temperature Solid Base and Liquid Low Vapor Pressure Base (DMAP & TEA), Varying Loadings of PAG (TPS-Tf) and Differing Protection Levels.

Resist formulations were obtained by mixing a partially protected polymer at varying levels of protection, as described above, with varying amounts (shown in the table below) of TEA, and DMAP, and TPS Tf. The total solid weight content in the solution was about 7.25%. AR3 reticle blanks were used as the substrate. The reticle blanks were cleaned in a solution of sulfuric acid and hydrogen peroxide and dehydration baked for 9 minutes at 120° C. The resist was spin-coated onto the reticle blank, followed by a hot plate bake step at 110° C. for 260 seconds. The resist was then exposed on an IBM-built high throughput e-beam projection system at 75 kV. After exposure, the resist was allowed to stand at room temperature for 30 minutes before being developed with 0.263 N TMAH.

| Polymer Protection Level (%) | PAG (wt %) | TEA Base (wt %) | DMAP Base (wt%) | Resist Profile |
| --- | --- | --- | --- | --- |
| 25 | 2.1 | 0.03 | 0.11 | Square top with larger dimension, some bowing, slight foot |
| 22 | 2.1 | 0.03 | 0.11 | Profile more vertical, slight foot, no residue |
| 25 | 2.8 | 0.03 | 0.11 | Square top with larger dimension, some bowing, slight foot |
| 22 | 2.8 | 0.03 | 0.11 | Profile near vertical, slight foot |

Example 6

Resist with a Mixture of Room Temperature Solid Base and Liquid Low Vapor Pressure Base (DMAP & TEA)

Resist formulations were obtained by mixing a partially protected polymer with a 22% protection level, as described above, with 0.03 wt. % (relative to the polymer) TEA, 0.11 wt % (relative to the polymer) DMAP, and 0.7 wt. % TPS-Tf. The total solid weight content in the solution was about 7.25%. AR3 reticle blanks were cleaned in a solution of sulfuric acid and hydrogen peroxide and dehydration baked for 9 minutes at 120° C. The resist was spin coated onto the reticle blank, followed by a hot plate bake step at 80° C. for 600 seconds. The resist was then exposed on an IBM-built high throughput e-beam projection system at 75 kV. After exposure, the resist was allowed to stand at room temperature for 30 minutes before being developed with 0.263 N TMAH for 90 seconds. The resulting images were residue free. The resist footing was minimal and the profile was nearly vertical.

What is claimed is:

1. A method of forming a patterned material structure on a substrate, said method comprising:
   (A) providing a substrate with a layer of said material wherein said material is chromium-containing metal composition,
   (B) applying a resist composition to said substrate to form a resist layer on said substrate, said resist composition comprising
      a) an imaging polymer,
      b) acid-labile moieties,
      c) a radiation-sensitive acid generator, and
      d) a base additive component, wherein said base additive component comprises:
         (i) a room temperature solid base consisting of N,N-dimethylaminopyridine, and
         (ii) a liquid low vapor pressure base consisting of triethanolamine, wherein a mole ratio of said low vapor pressure base to said solid base is in the range of 0.15 to 0.5,
   (C) patternwise exposing said substrate to electron beam radiation whereby acid is generated by radiation-sensitive acid generator in exposed regions of said resist layer,
   (D) forming a patterned resist structure having a vertical profile by removing radiation-exposed portions of said resist, and
   (E) transferring resist structure pattern to said material layer by removing portions of said material layer through spaces in said resist structure pattern.

2. The method of claim 1 wherein said acid-labile protecting group is a moiety selected from the group consisting of ketals, and orthoesters.

3. The method of claim 1 wherein said transfer of step (E) comprises reactive ion etching.

4. The method of claim 1 wherein at least one intermediate layer is provided between said material layer and said resist layer, and step (E) comprises etching through said intermediate layer.

5. The method of claim 1 wherein said resist is thermally treated between steps (C) and (D).

* * * * *